United States Patent
Huang et al.

(10) Patent No.: US 9,305,880 B2
(45) Date of Patent: Apr. 5, 2016

(54) INTERCONNECTS FOR SEMICONDUCTOR DEVICES

(71) Applicant: Taiwan Semiconductor Manufacturing Co., Ltd., Hsin-Chu (TW)

(72) Inventors: Fu-Ming Huang, Shengang Township (TW); Han-Hsin Kuo, Tainan (TW); Chi-Ming Tsai, New Taipei (TW); Liang-Guang Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/061,782

(22) Filed: Oct. 24, 2013

(65) Prior Publication Data

US 2015/0115447 A1    Apr. 30, 2015

(51) Int. Cl.
*H01L 21/4763* (2006.01)
*H01L 23/532* (2006.01)
*H01L 21/321* (2006.01)
*H01L 21/768* (2006.01)

(52) U.S. Cl.
CPC ........ *H01L 23/53238* (2013.01); *H01L 21/321* (2013.01); *H01L 21/76862* (2013.01); *H01L 21/76883* (2013.01); *H01L 2924/0002* (2013.01)

(58) Field of Classification Search
USPC ........... 257/632, 751, 762; 438/643, 692, 785
See application file for complete search history.

(56) References Cited

U.S. PATENT DOCUMENTS

| | | | |
|---|---|---|---|
| 6,294,027 B1 * | 9/2001 | Li et al. ............................ | 134/3 |
| 2007/0004230 A1 * | 1/2007 | Johnston et al. ............... | 438/785 |
| 2008/0153305 A1 * | 6/2008 | Liang ................ | H01L 21/02071 438/712 |
| 2010/0072581 A1 * | 3/2010 | Nakasaki et al. ............. | 257/632 |

OTHER PUBLICATIONS

Sekiguchi, A. et al., "Formation of Slit-Like Voids at Trench Corners of Damascene Cu Interconnects", Materials Transactions, 2002, 43(7):1633-1637.

* cited by examiner

*Primary Examiner* — Errol Fernandes
(74) *Attorney, Agent, or Firm* — Duane Morris LLP

(57) ABSTRACT

A semiconductor substructure with improved performance and a method of forming the same is described. The method includes providing a semiconductor dielectric layer having a recess formed therein; forming an interconnect structure with a metal liner and a conductive fill within the recess; and applying an electron beam treatment to the substructure.

19 Claims, 8 Drawing Sheets

INTERCONNECTS FOR SEMICONDUCTOR DEVICES

TECHNICAL FIELD

The disclosure relates to semiconductor fabrication, and more particularly, relates to interconnects for semiconductor devices.

BACKGROUND

The semiconductor integrated circuit (IC) fabrication process includes front-end-of-line (FEOL) processing for fabricating semiconductor devices, e.g. transistors, and back-end-of-line (BEOL) processing for connecting the individual devices. In particular, the BEOL processing provides interconnects for the devices. The interconnects typically include conductive (e.g., metal) horizontal lines and vertical vias isolated by the dielectric material of the semiconductor device.

Trenches and vertical interconnect accesses (vias) are patterned into the dielectric layer and filled with the conductive material forming wires connecting metal layers and/or devices. As ICs and other semiconductor devices have become smaller, the substructures—including the interconnects—have become smaller, and copper (Cu) has replaced aluminum (Al) as the conductive material. Cu has a lower resistivity and better reliability than Al.

For Cu interconnects, conventional BEOL methods use a damascene process to pattern the trenches and vias into the dielectric material, fill these recesses with interconnect materials, and then planarize the wafer surface. Chemical mechanical polishing (CMP) is used to remove the excess material and planarize the wafer surface. CMP combines a chemical slurry with a mechanical polishing pad to remove the conductive interconnect material in a uniform, planar fashion, providing a smooth, uniform surface, upon which additional dielectric layers and conductive line layers are formed. However, the slurry chemicals are corrosive and degrade the interconnect substructures, leading to reduced reliability for the devices.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawing.

DETAILED DESCRIPTION

Figure 1:
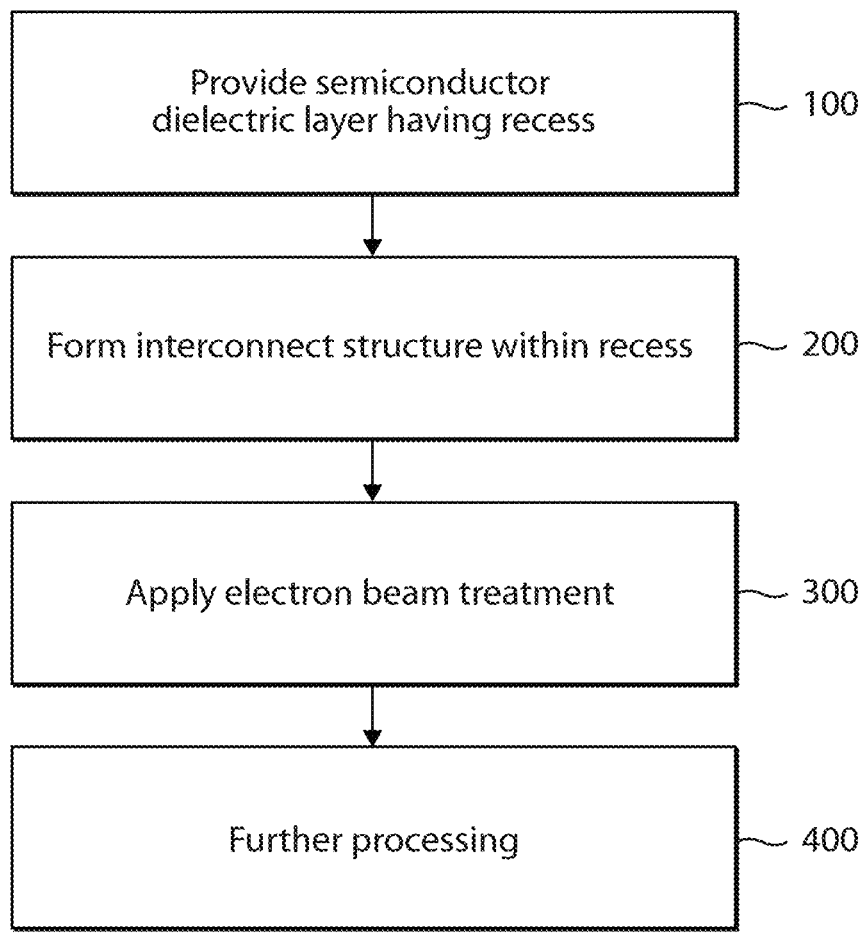
FIG. 1 is a flow chart showing an exemplary method of the disclosure.

The disclosure provides for the fabrication of semiconductor integrated circuit (IC) devices and components, including interconnect conductive structures. The conductive structures can be interconnects including stage contacts, vias connecting metal layers at different topographical locations, or trenches for forming metal lines extending laterally that contact other metal lines, vias or contacts. The following illustrated embodiments are intended to be exemplary only as the illustrated methods and structures and may be used in other applications. In other words, the methods described herein for electron beam treatment of a conductive line in a trench over a semiconductor material can also be used for treating a via over a metal material or a contact over semiconductor materials, etc.

In the description, relative terms such as "lower," "upper," "horizontal," "vertical," "over" "above," "below," "up," "down," "top" and "bottom" as well as derivatives thereof (e.g., "downwardly," "upwardly," etc.) should be construed to refer to the orientation as then described or as shown in the drawing under discussion. These relative terms are for convenience of description and do not require that the device be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 4A:
FIGS. 4A-4E are cross-sectional views of a semiconductor substructure in accordance with the disclosure.
Figure 4B:
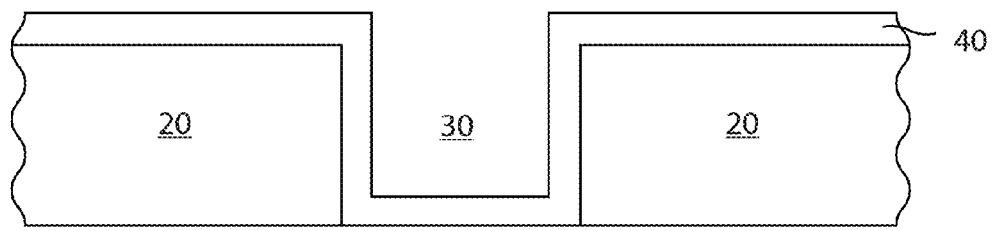
Figure 4C:
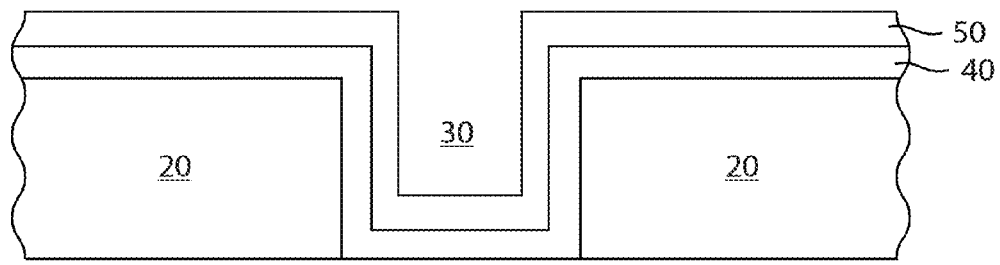
Figure 4D:
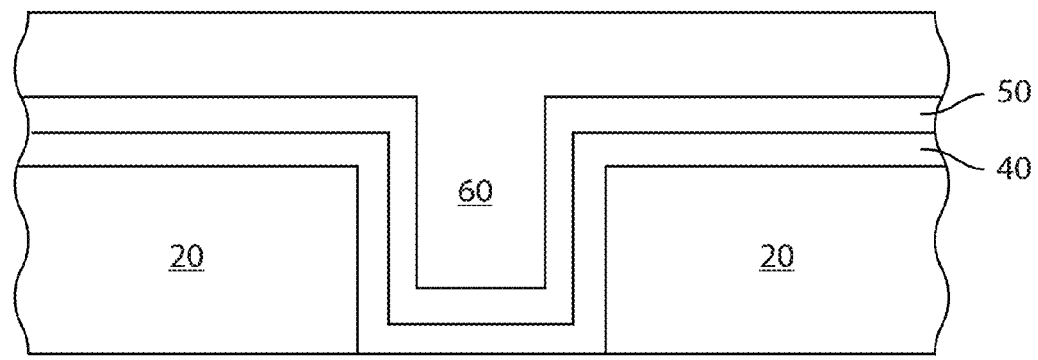
Figure 4E:
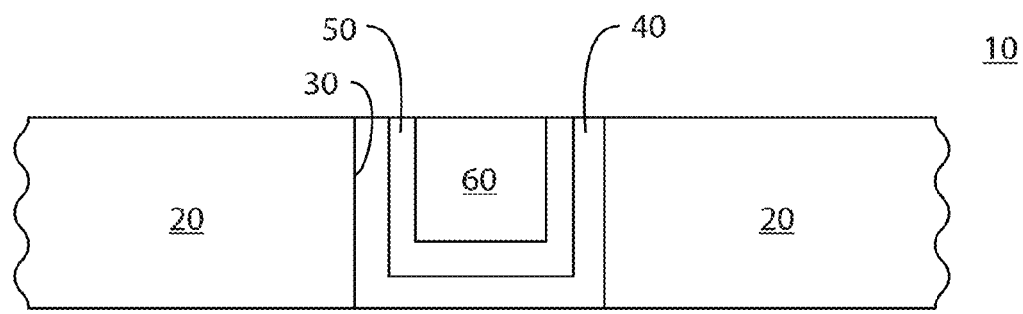

FIG. 4E shows a semiconductor substructure 10 including a dielectric material 20 having a recess 30. The recess contains a barrier layer 40, a liner layer 50, and a conductive fill material 60. As shown in the cross-sectional view in FIG. 4E, a semiconductor substructure 10 according to this disclosure includes a semiconductor dielectric layer 20 having a recess 30 filled with an interconnect, which can be a conductive line, conductive via or contact. The interconnect includes a metal liner 50 within the recess 30 of the dielectric layer 20 and a conductive fill 60 over the metal liner 50 and within the recess 30. In some embodiments, the metal liner 50 includes Co. In some embodiments, the conductive fill includes Cu. In some embodiments, the interconnect structure also includes a barrier layer 40 between the dielectric layer 20 and the metal liner 50.

A broad overview of the method used to fabricate the semiconductor substructure 10 according to the disclosure is provided in FIG. 1. Further details of the method and structures formed according to the methods are described herein and provided in conjunction with the accompanying figures. As shown in FIG. 1, a semiconductor dielectric layer having a recess is provided at step 100, an interconnect structure is formed within the recess at step 200, and an electron beam treatment is applied at step 300.

Figure 2:
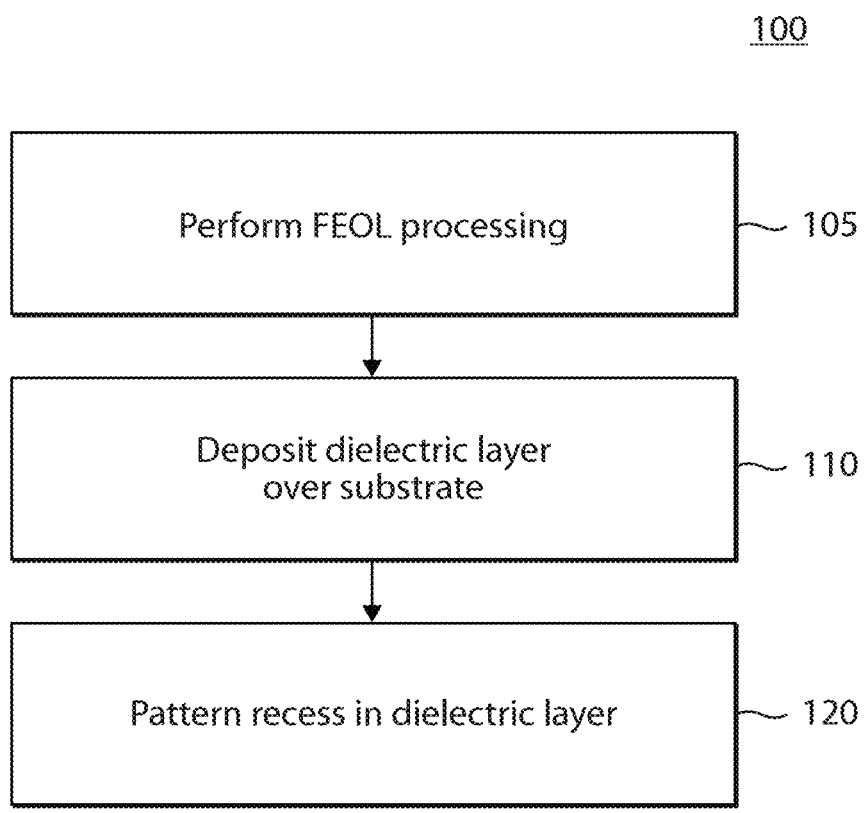
FIG. 2 is a flow chart of a method for step 100 of FIG. 1.

In some embodiments, providing the semiconductor dielectric layer having a recess includes substeps 105, 110 and 120 as shown in FIG. 2. At substep 105, FEOL processing is performed. A plurality of active and/or passive devices (including, for example, transistors, diodes, capacitors and resistors) are formed in the surface of a semiconductor substrate. The substrate can be silicon (Si), including crystalline silicon, silicon on insulator, group III-V compound materials, or other suitable materials used as substrates in the manufacture of semiconductor devices.

At substep 110, the dielectric layer is deposited over a substrate. The dielectric layer can be an oxide (e.g. silicon dioxide), an oxynitride (e.g. silicon oxynitrides), a low-k dielectric, a high-k dielectric or other dielectric materials suitable to electrically the insulate conductive substructures. The dielectric layer material may be chosen in conjunction with the conductive material that will be used to substantially fill the recess formed within dielectric layer. For example, the conductive fill material can include copper (Cu) and the dielectric layer material can be a low-k dielectric. As used herein, the term "low-k" refers to a material having a dielectric constant less than that of silicon dioxide (i.e., less than about 3.5) and can also include extreme low-k materials having a dielectric constant of approximately 2.6 or less. The dielectric layer can also be formed from a stack of dielectric films. At substep 120, a recess 30 is patterned in the dielectric layer 20 as shown in FIG. 4A. The recess 30 can be a via or a trench. A plurality of recesses 30 can also be patterned in the dielectric layer 20.

Step 200 of FIG. 1 provides for the formation of an interconnect structure (i.e., conductive line, conductive via or contact) within the recess. The interconnect structure includes conductive materials and is electrically insulated by the surrounding dielectric layer. In some embodiments, the interconnect structure includes a metal liner over the recess and a conductive fill over the metal liner. The recess can be filled using single damascene, double damascene, or other suitable techniques. The conductive fill can be Cu, Al, Au or other conductive materials suitable for a semiconductor interconnect. As used herein, the terms "fill" and "filling" refer to at least a portion of the material being disposed within and substantially filling open space in the recess. In some embodiments, the conductive fill can be deposited within the recess and include a line width ranging from about 15 nm to about 90 nm. As used herein, the term "line width" with respect to the conductive fill refers to the width of the fill in the plane of the substrate, as seen from a top view of the substructure. As used herein, the term "about" with respect to width includes minor deviations from the nominal value. For example, deviations of plus or minus 1 nm, plus or minus 2 nm, or plus or minus 5 nm.

The metal liner can be a conductive material that adheres to the conductive fill material and inhibits delamination of the conductive fill during subsequent processing and use of the device. For example, the metal liner can include Ru, Ta, such as Ta or TaN, and can preferably include cobalt (Co), such as a Co or CoN film. In some embodiments, the metal liner is a thin film. For example, the metal liner can be deposited in a line width ranging from about 0.5 nm to about 15 nm. For greater widths, the deviation can be greater. For example a 1 nm nominal value may include deviations of plus or minus 0.1 nm, while a width of 15 nm may include deviations of plus or minus 2 nm. In some embodiments, the metal liner can provide a barrier between the conductive fill and the dielectric layer to inhibit electromigration of the conductive fill material, such as Cu, into the surrounding dielectric layer.

In other embodiments, the interconnect structure can also include a separate barrier layer between the recess and the metal liner. The barrier layer can be a conductive material that acts as a barrier to electromigration of the conductive fill material into the surrounding dielectric layer. In some embodiments, the barrier layer can be a metal, such as tantalum (Ta), tungsten (W), and compounds including such metals (e.g. TaN) In other embodiments, the liner comprises cobalt (Co), nickel (Ni), nichrome, Ta, hafnium (Hf), niobium (Nb), zirconium (Zr), vanadium (V), tungsten (W), ruthenium (Ru), TaN, indium oxide, tungsten nitride, titanium nitride, indium oxide, or copper silicide. In some embodiments, the metal liner is a thin film. For example, the barrier layer can be deposited in a line width ranging from about 0.5 nm to about 15 nm. As used herein, the term "line width" with respect to the metal liner or barrier layer refers to the distance a top view of the liner/layer from the side most proximate the fill to the side least proximate the fill.

Figure 3:
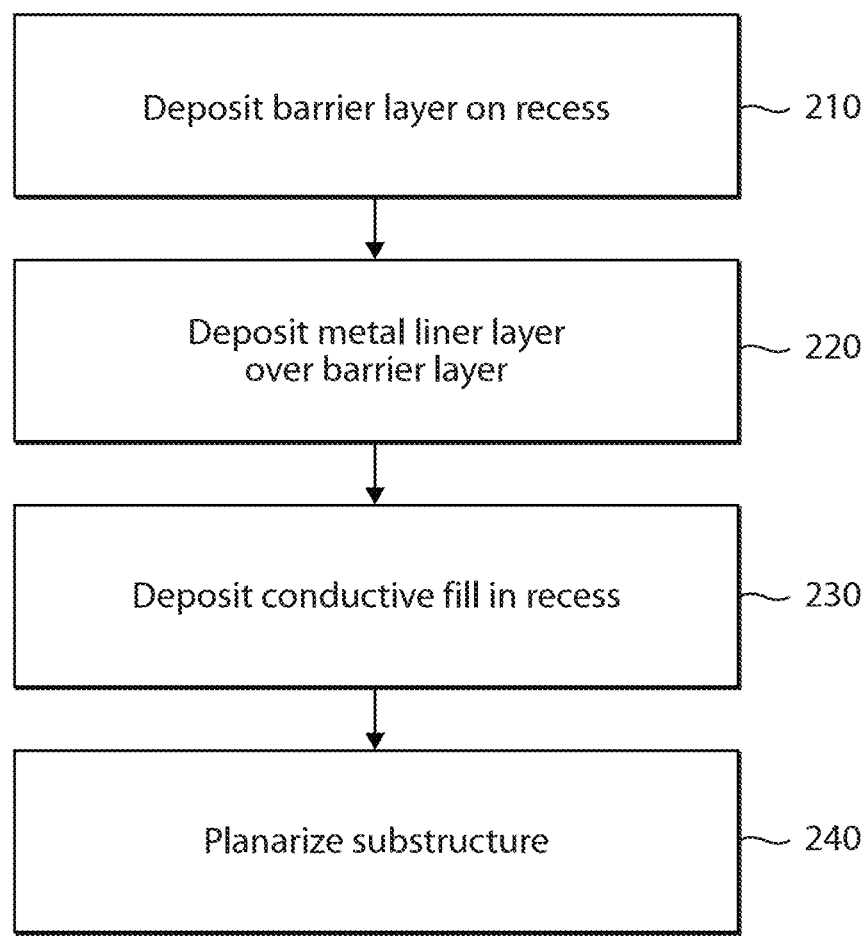
FIG. 3 is a flow chart of a method for step 200 of FIG. 1.

In some embodiments, forming the interconnect structure (step 200 of FIG. 1) includes substeps 210 to 240 as shown in FIG. 3. At substep 210, the barrier layer 40 is deposited in the recess 30. The resulting structure is as shown in FIG. 4B. At substep 220, the metal liner 50 is deposited over the barrier layer 40. The resulting structure is as shown in FIG. 4C. At substep 230, the remainder of the recess 30 is filled with a conductive fill. In some embodiments, the conductive fill is Cu. The resulting structure is as shown in FIG. 4D. The metal liner or barrier layer can be formed using physical vapor deposition, chemical vapor deposition, or other suitable deposition techniques. The conductive fill can be formed using electrochemical plating or other suitable deposition techniques. The deposition of the barrier layer, metal liner and fill can result in an uneven upper surface of the interconnect structure and/or the interconnect structure materials deposited on an upper surface of the dielectric layer outside of the recess. To remove these materials and smooth the upper surface of the substructure, the substructure is planarized.

Figure 5:
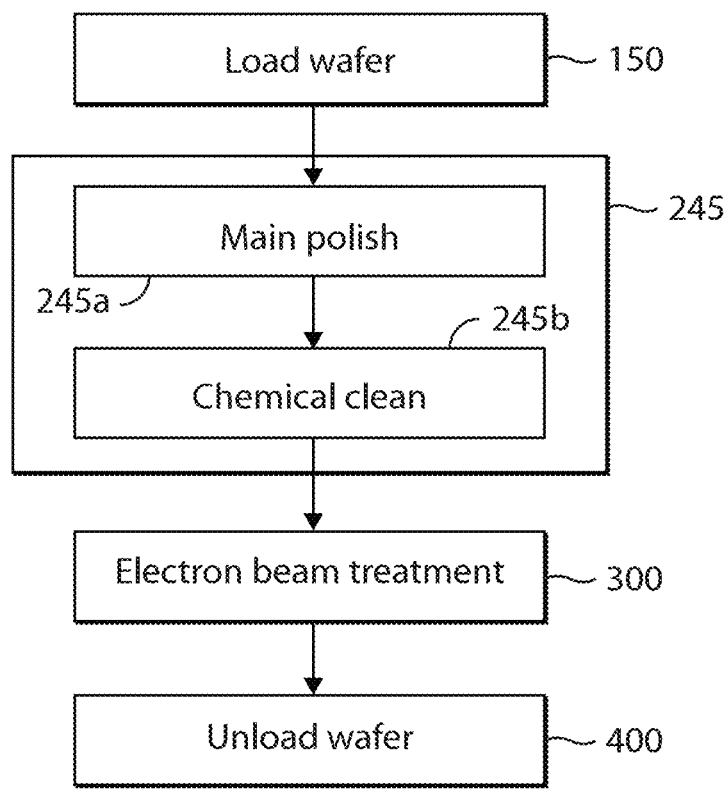
FIG. 5 is a flow chart showing an exemplary method of the disclosure.

The substructure can be planarized using chemical, mechanical or other suitable planarization techniques. In some embodiments as shown in FIG. 5, the substructure can be planarized by a mechanical polish at substep 245*a* followed by a chemical clean at substep 245*b*. In other embodiments, the polish and clean substeps can be combined via CMP at combined substep 245. CMP uses a chemical slurry in conjunction with a polishing pad. CMP techniques also provide the ability to planarize the substructure 10 down to to the upper interface between the dielectric layer and the next layer of inter-layer dielectric (ILD) material as shown in FIG. 4E. That is, the CMP step removes excess metal above the dielectric layer 20, to the left and right of the recess 30, so as to expose the dielectric layer 20.

At step 300, an electron beam treatment is applied to the substructure 10 after the planarization substep 245. The electron beam treatment includes focusing a beam of high-energy electrons on the interconnect structure to treat the structure and remove corrosion between the deposited interconnect materials. In particular, the electron beam treatment avoids formation of a slit at the interface between the conductive fill and the metal liner and improves the adhesion between the fill and metal liner (e.g. Co).

In some embodiments, the electron beam power can be about 100 volts (V) or more, 500 V or more, 1,000 V or more, 2,500 V or more, 4,000 V or more, 5,000 V or more, 6,000 or more, 7,500 or more, 8,000 or more, or 10,000 or more. In other embodiments, the electron beam power can be about 15,000 V or less, 12,500 V or less, 12,000 V or less, 11,500 V or less, 11,000 V or less, 10,500 V or less, 10,000 V or less, 7,500 V or less, or 5,000 V or less, or 1,000 V or less. In some embodiments, the electron beam power can range between a combination of the foregoing. For example, ranging from about 100 V to 15,000 V, 1,000 V to 15,000 V, 4,000 V to 12,000 V, 5,000 V to 10,000 V, or 5,000 V to 11,000 V. As used herein, the term "about" with respect to power includes minor deviations from the nominal value. For example, deviations of plus or minus 1 V, or plus or minus 5 V, or plus or minus 10 V. In some embodiments, the electron beam can be generated by a scanning electron microscope (SEM) inspection tool or other electron beam processing devices. For example, the electron beam can be generated by a multi-purpose or a defect review SEM.

In some embodiments, the process time for the electron beam treatment can be about 10 seconds (s) or more, 30 s or more, 60 s or more, 100 s or more, 150 s or more, and 200 s or more. In other embodiments, the process time can be about 300 s or less, 275 s or less, 250 s or less, 200 s or less and 150 s or less. In other embodiments, the process time can range between a combination of the foregoing. For example, ranging from about 10 s to 300 s, 60 s to 300 s 100 s to 300 s, 200 to 300 s, 30 s to 150 s, 60 to 275 s, and 200 to 275. As used herein, the term "about" with respect to time includes minor deviations from the nominal value. For example, deviations of plus or minus 1 s, or plus or minus 5 s.

In some embodiments, the electron beam treatment can be applied in situ. For example as shown in FIG. 5, the method can include loading a semiconductor wafer having the interconnect structure into a chamber at substep 150, planarizing the substructure at substep 245, and applying the electron beam treatment within the same chamber at substep 300. In some embodiments, the electron beam treatment can be applied in a vacuum, so that it is unnecessary to open the chamber after the planarizing step 245.

Figure 7:
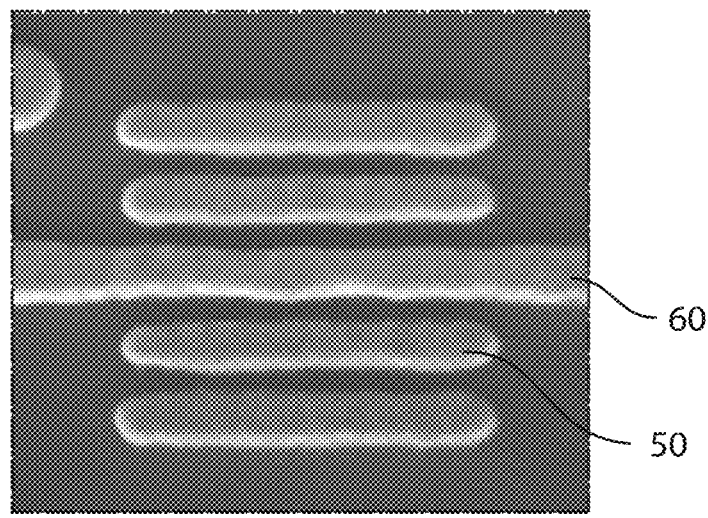
FIG. 7 is an SEM image of top view of a semiconductor substructure in accordance with the disclosure.

As shown in FIG. 7, following the electron beam treatment at step 300, a slit has been eliminated from the interconnect structure, including between the metal liner 50 and the Cu fill 60.

After the electron beam treatment, the wafer can be unloaded and undergo additional processing operations at step 400 for forming additional interconnect layers (i.e., conductive line layers and/or conductive via layers), passivation, singulation, IC package assembly and/or testing. For example, further processing can include forming additional structures over or on the interconnect structure, interconnection/bonding, encapsulation, marking, performance and reliability testing, etc.

Comparison with Example Substructures

For comparison, semiconductor devices were fabricated using a damascene process to form interconnects with Co metal liners and Cu fills according to conventional methods (W00) and according to the disclosure (W01). In particular, each of the devices were fabricated on a Si substrate with a low-k dielectric having a dielectric constant of 2.5. Recesses were patterned into the dielectric and a Ta/TaN barrier layer, Co metal liner and Cu conductive fill were deposited in recesses in the dielectric. Each of the Ta/TaN barrier and Cu liner were deposited with a thickness of 700 Å. The substructure was planarized using CMP. An electron beam treatment was applied to the W01 devices using an Applied Materials® SEMVision G4 defect review SEM at a power between 5,000-11,000 V and process time of 180 s.

Figure 6:
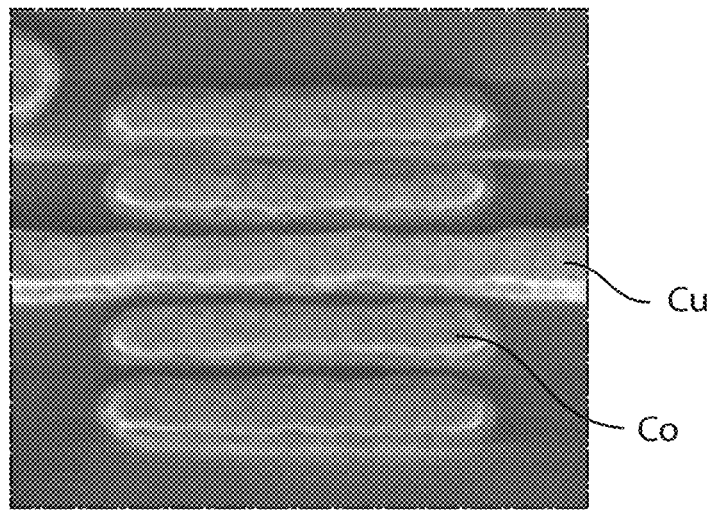
FIG. 6 is an SEM image of top view of a conventional semiconductor substructure.

FIG. 6 is a SEM image of a top view of the interconnect structure of the W00 device, showing a slit in the Co—Cu interface caused by corrosion and pressure from the CMP process. FIG. 7 is a SEM image of a top view of the interconnect structure of the W01 device, showing that the slit in the Co—Cu interface was eliminated in the W01 device.

Figure 8:
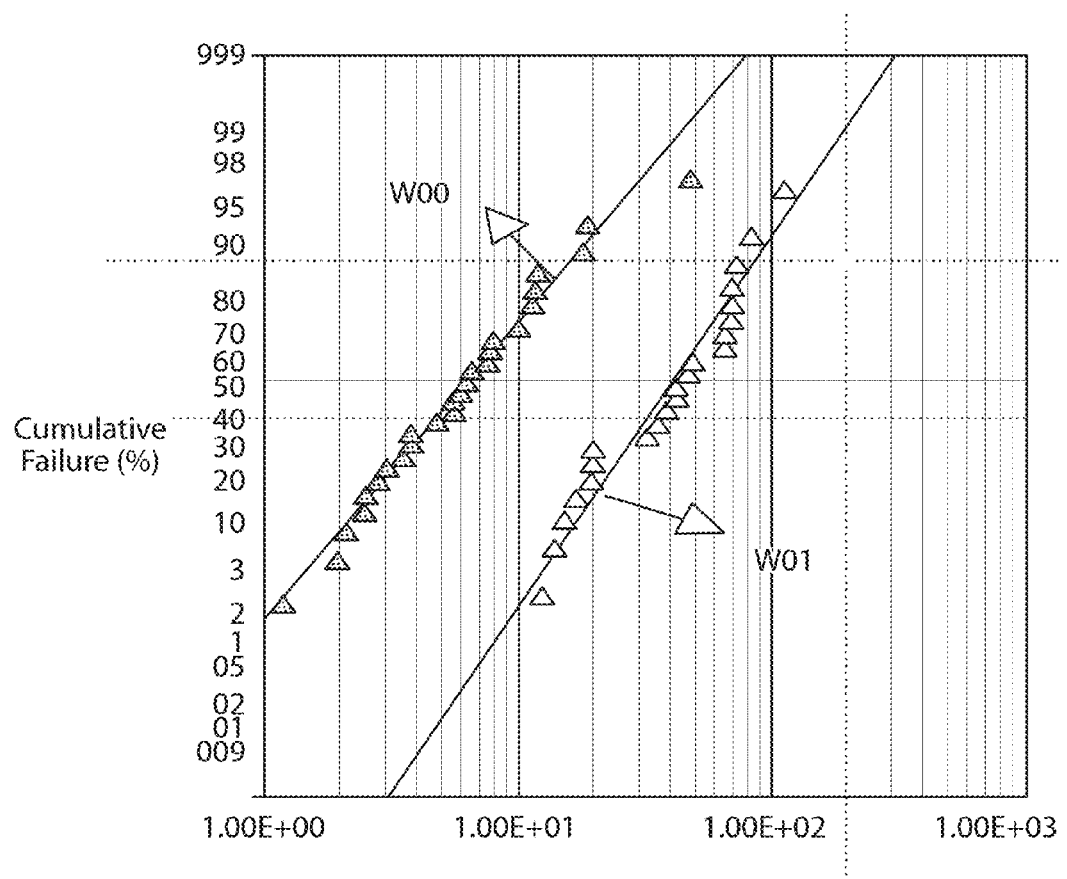
FIG. 8 is a chart showing cumulative failure data for a conventional semiconductor substructure and a substructure in accordance with the disclosure.

Reliability testing was conducted on the W00 and W01 devices over a 2 week period at a temperature of 300° C. and a testing current density of 3 mgA/cm$^2$. FIG. 8 is a chart of cumulative failure over time. The W00 line indicates data points for the conventional device and the W01 line indicates data points for the device according to the disclosure. The results demonstrate a consistent and significant improvement in the reliability of the W01 devices.

In summary, the disclosure provides effective methods for forming improved semiconductor substructures with low resistance and improved reliability and performance. The substructures according to the disclosure have greater adhesion between the Cu fill and metal liner, further inhibiting electromigration and delamination of the conductive fill, and increasing reliability of the devices. Furthermore, the electron beam treatment step according to the disclosure can be incorporated efficiently into production.

In some embodiments, a method for forming a semiconductor substructure includes the steps of providing a semiconductor dielectric layer having a recess formed therein; forming an interconnect structure including a metal liner and a conductive fill within the recess; and applying an electron beam treatment to the interconnect structure.

In some embodiments, the conductive fill comprises Cu.

In some embodiments, the forming step includes the steps of depositing a barrier layer in the recess; depositing a metal liner layer over the barrier layer; filling the recess with the conductive fill after depositing the liner layer; and planarizing the interconnect structure.

In some embodiments, the planarizing step and the applying step are performed under vacuum in a chamber without releasing the vacuum therebetween.

In some embodiments, the planarizing step is performed via CMP.

In some embodiments, the applying step includes removing corrosion from said interconnect structure.

In some embodiments, the electron beam treatment is applied for a period of about 10 s to about 300 s.

In some embodiments, the electron beam treatment is applied for a period of about 100 s to about 300 s.

In some embodiments, the electron beam treatment is applied for a period of about 200 s to about 300 s.

In some embodiments, the electron beam treatment includes an electron beam having a power ranging from about 100 V to about 15,000 V.

In some embodiments, the step of providing a semiconductor dielectric layer having a recess formed therein includes the steps of depositing a dielectric layer over a semiconductor substrate and patterning the recess in the dielectric layer.

In some embodiments, a method for forming a semiconductor substructure includes the steps of loading a wafer into a process chamber, polishing a surface of the wafer, cleaning the surface with a chemical clean, and applying an electron beam treatment to the wafer. The wafer includes a semiconductor dielectric layer having a recess formed therein, a metal liner in the recess, and a conductive fill over the metal liner in the recess.

In some embodiments, the polishing and cleaning step are performed via CMP.

In some embodiments, the electron beam treatment step is applied via a SEM device.

In some embodiments, the applying step is performed in a vacuum within the chamber and the method further includes the step of unloading the wafer from the chamber after the applying step.

In some embodiments, the applying step is performed in a vacuum within the chamber without releasing the vacuum between the CMP and the applying step.

In some embodiments, a semiconductor substructure includes a semiconductor dielectric layer having a recess formed therein, a metal liner over the dielectric layer within the recess, a conductive fill over the metal liner and within the recess, and a substantially corrosion-free interface between the metal liner and the conductive fill.

In some embodiments, the metal liner includes Co.

In some embodiments, the semiconductor substructure further includes a barrier layer between the dielectric layer and the metal liner.

In some embodiments, the barrier layer includes TaN.

The descriptions of the fabrication techniques for exemplary embodiments may be performed using any suitable commercially available equipment commonly used in the art to manufacture semiconductor devices, or alternatively, using future developed equipment and techniques.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming an interconnect structure, comprising:
    providing a dielectric layer above a semiconductor substrate, the dielectric layer having a recess formed therein;
    forming an interconnect structure comprising a metal liner and a conductive fill within said recess;
    applying an electron beam treatment to said interconnect structure by focusing a beam of electrons on the interconnect structure; and
    planarizing said interconnect structure, wherein said planarizing step and said applying step are performed under vacuum in a chamber without releasing the vacuum therebetween.

2. The method as in claim 1, wherein said conductive fill comprises copper (Cu).

3. The method as in claim 1, wherein said forming step comprises:
    depositing a barrier layer in said recess;
    depositing a metal liner layer over said barrier layer; and
    filling said recess with said conductive fill after depositing the liner layer.

4. The method as in claim 3, wherein said planarizing step is performed via chemical mechanical polishing (CMP).

5. The method as in claim 2, wherein said applying step comprises removing corrosion from said interconnect structure.

6. The method as in claim 1, wherein said electron beam treatment is applied for a period of about 10 s to about 300 s.

7. The method as in claim 1, wherein said electron beam treatment is applied for a period of about 100 s to about 300 s.

8. The method as in claim 1, wherein said electron beam treatment is applied for a period of about 200 s to about 300 s.

9. The method as in claim 1, wherein said electron beam treatment comprises an electron beam having a power ranging from about 100 V to about 15,000 V.

10. The method as in claim 1, wherein said step of providing a semiconductor dielectric layer having a recess formed therein comprises:
    depositing a dielectric layer over a semiconductor substrate; and
    patterning the recess in said dielectric layer.

11. The method as in claim 1, wherein said forming step comprises:
    depositing a metal liner layer in said recess and
    filling said recess with the conductive fill after depositing the liner layer,
    wherein the deposited metal liner has a line width ranging from about 0.5 nm to 15 nm and the deposited conductive full has a line width ranging from about 15 nm to 90 nm.

12. The method as in claim 1, wherein said metal liner comprises cobalt (Co).

13. A method for forming an interconnect structure, comprising:
    loading a wafer in a process chamber, said wafer comprising:
        a dielectric layer above a semiconductor material of the wafer, the dielectric layer having a recess formed therein,
        a metal liner in said recess, and
        a conductive fill over said metal liner in said recess;
    polishing a surface of said wafer;
    cleaning said surface with a chemical clean; and
    applying an electron beam treatment to said wafer, wherein the applying step is performed in a vacuum within said chamber without releasing the vacuum between the polishing and cleaning steps and the applying step.

14. The method as in claim 12, wherein said polishing and cleaning step are performed via CMP.

15. The method as in claim 12, wherein the electron beam treatment step is applied via a SEM device.

16. The method as in claim 12, further comprising unloading said wafer from said chamber after said applying step wherein said applying step is performed in a vacuum within said chamber.

17. A method for forming an interconnect structure, comprising:
    providing a dielectric layer above a semiconductor substrate, the dielectric layer having a recess formed therein;
    forming an interconnect structure within said recess by depositing a barrier layer in said recess, depositing a metal liner layer over said barrier layer, filling said recess with said conductive fill after depositing the liner layer, and planarizing said interconnect structure; and
    applying an electron beam treatment to said interconnect structure, wherein said planarizing step and said applying step are performed under vacuum in a chamber without releasing the vacuum therebetween.

18. The method as in claim 17, wherein the electron beam treatment step is applied via a SEM device.

19. The method as in claim 17, wherein performance of said electron beam treatment removes corrosion from an interface between the conductive fill and metal liner.

* * * * *